(12) United States Patent
Motojima

(10) Patent No.: US 12,663,731 B2
(45) Date of Patent: Jun. 23, 2026

(54) EXPOSURE APPARATUS, EXPOSURE METHOD, AND ARTICLE MANUFACTURING METHOD

(71) Applicant: CANON KABUSHIKI KAISHA, Tokyo (JP)

(72) Inventor: Junichi Motojima, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 133 days.

(21) Appl. No.: 18/637,683

(22) Filed: Apr. 17, 2024

(65) Prior Publication Data

US 2024/0361707 A1      Oct. 31, 2024

(30) Foreign Application Priority Data

Apr. 25, 2023     (JP) ................................. 2023-071693

(51) Int. Cl.
*G03F 7/00*              (2006.01)
(52) U.S. Cl.
CPC ...... *G03F 7/70775* (2013.01); *G03F 7/70725* (2013.01)
(58) Field of Classification Search
CPC ............. G03F 7/70775; G03F 7/70725; G03F 9/7046; G03F 9/7034; G03F 7/7085; G03F 7/70716
See application file for complete search history.

(56) References Cited

U.S. PATENT DOCUMENTS

| | | | |
|---|---|---|---|
| 8,625,072 B2 * | 1/2014 | Sato | G03B 27/58 |
| | | | 355/53 |
| 11,435,672 B2 * | 9/2022 | Shibazaki | G03F 7/70633 |
| 12,072,638 B2 * | 8/2024 | Ota | G03F 9/7026 |
| 2002/0166982 A1 | 11/2002 | Kataoka et al. | |

(Continued)

FOREIGN PATENT DOCUMENTS

| | | |
|---|---|---|
| JP | 6491833 B2 | 3/2019 |
| KP | 1020180056398 A | 5/2018 |

(Continued)

OTHER PUBLICATIONS

Extended European Search Report issued in European Appln. No. 24169851.3 mailed Apr. 14, 2025.

(Continued)

*Primary Examiner* — Hung V Nguyen
(74) *Attorney, Agent, or Firm* — ROSSI, KIMMS & McDOWELL LLP

(57) ABSTRACT
An exposure apparatus for projecting a pattern of an original onto a substrate by a projection optical system, and exposing the substrate, is provided. The apparatus includes a stage configured to move while holding the substrate, a measurement device configured to perform, at a plurality of measurement points in an exposure region, measurement of a height position of the substrate held by the stage, and a controller configured to control the measurement device, and correct a position of the stage based on a result of the measurement such that a shift amount of the height position with respect to an image plane of the projection optical system is decreased. The controller is configured to set the plurality of measurement points in the exposure region based on information regarding the exposure region.

15 Claims, 11 Drawing Sheets

(56) References Cited

U.S. PATENT DOCUMENTS

| | | | |
|---|---|---|---|
| 2007/0229791 A1* | 10/2007 | Inoue | G01B 11/0608 |
| | | | 356/600 |
| 2015/0042969 A1 | 2/2015 | Morikuni et al. | |
| 2016/0306284 A1 | 10/2016 | Nishimura | |

FOREIGN PATENT DOCUMENTS

| | | |
|---|---|---|
| KR | 100776496 B1 | 11/2007 |
| KR | 1020180056398 A | 5/2018 |
| KR | 1020230047898 A | 4/2023 |

OTHER PUBLICATIONS

Partial European search report issued in European Appln. No. 24169851.3, mailed on Jan. 8, 2025.

* cited by examiner

F I G.  1
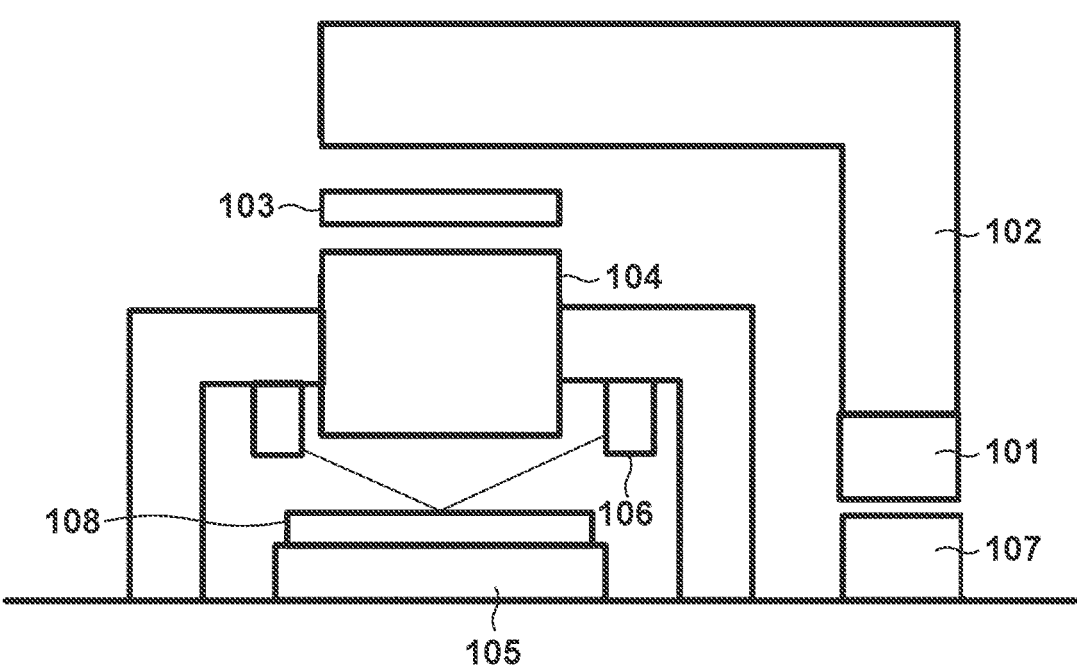

F I G.  3
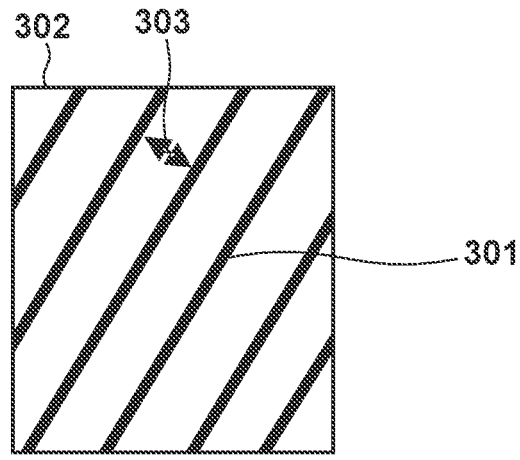
F I G.  4
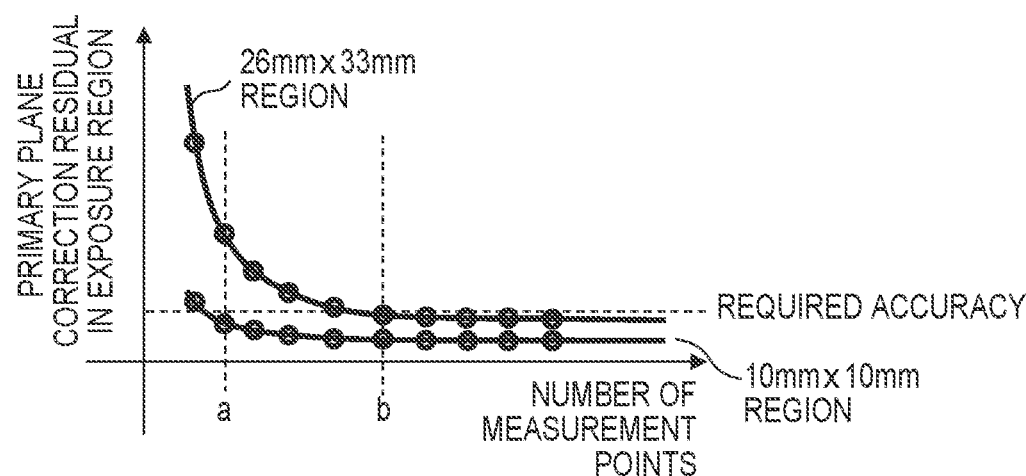

N=1

N=4

N=9

$N=n^2$

CENTER OF SUB-REGION IS DETERMINED AS MEASUREMENT POSITION

MEASUREMENT POSITION

HEIGHT MAP OF
ENTIRE AREA IS
ACCURATELY
MEASURED

NOT MEASURED

DIFFERENTIAL VALUE
IN ADJACENT HEIGHT

☐ DIFFERENTIAL VALUE>T1

▨ DIFFERENTIAL VALUE≤T1

MEASUREMENT
REPRODUCIBILITY
IN SAME POSITION

☐ σ>T2

▨ σ≤T2

○ MEASUREMENT
POSITION

F I G. 17C

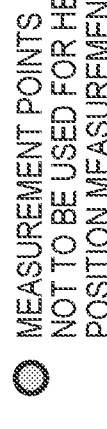

○ MEASUREMENT POINTS
TO BE USED FOR HEIGHT
POSITION MEASUREMENT

◉ MEASUREMENT POINTS
NOT TO BE USED FOR HEIGHT
POSITION MEASUREMENT

F I G. 17B

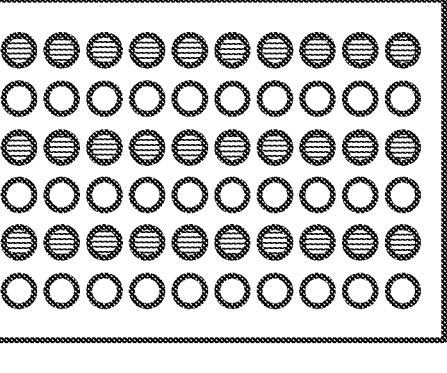

○ MEASUREMENT POINTS
TO BE USED FOR HEIGHT
POSITION MEASUREMENT

◉ MEASUREMENT POINTS
NOT TO BE USED FOR HEIGHT
POSITION MEASUREMENT

F I G. 17A

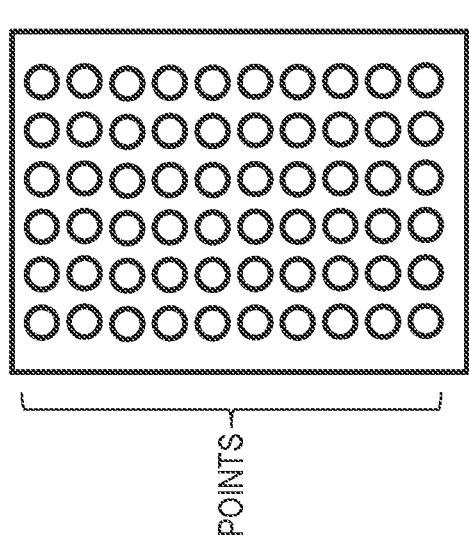

n POINTS m POINTS

○ MEASUREMENT POINTS
TO BE USED FOR HEIGHT
POSITION MEASUREMENT

◉ MEASUREMENT POINTS
NOT TO BE USED FOR HEIGHT
POSITION MEASUREMENT

F I G. 18
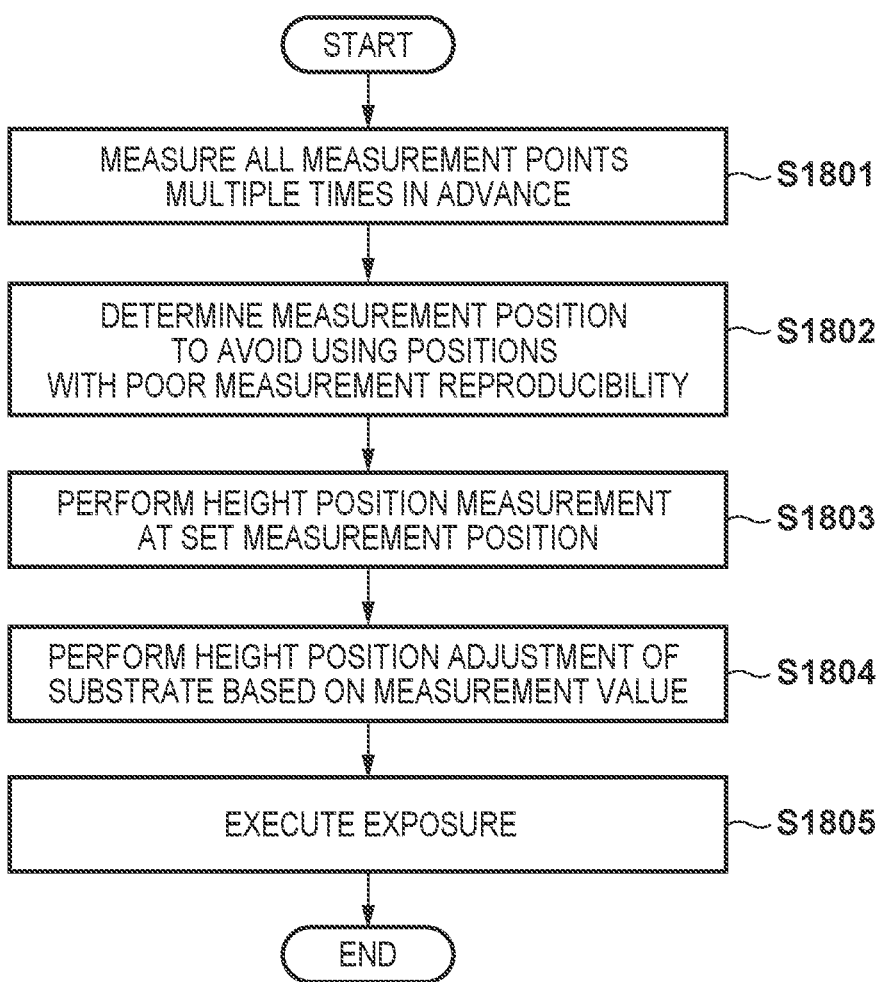

○ MEASUREMENT POINTS TO BE USED FOR HEIGHT POSITION MEASUREMENT

◐ MEASUREMENT POINTS NOT TO BE USED FOR HEIGHT POSITION MEASUREMENT

EXPOSURE APPARATUS, EXPOSURE METHOD, AND ARTICLE MANUFACTURING METHOD

BACKGROUND OF THE INVENTION

Field of the Invention

The present invention relates to an exposure apparatus, an exposure method, and an article manufacturing method.

Description of the Related Art

As an exposure apparatus used in the manufacture of a semiconductor device or the like, there are a step-and-repeat type exposure apparatus (stepper) and a step-and-scan type exposure apparatus (scanner). The stepper is a low cost apparatus as compared to the scanner, and used in a step in which high resolution and high precision overlay are not required. In the stepper, after a stage mounted with a substrate is driven to an exposure shot position, a height measurement apparatus measures the distance from a projection lens. The stage is focused on the projection lens in accordance with the measurement value, and then exposure is performed.

Japanese Patent No. 6491833 discloses a height measurement apparatus that measures the height of a sample based on the projection image of a two-dimensional slit. The two-dimensional slit includes a plurality of slits arrayed at a fine pitch, and measurement light beams having passed through the respective slits are received by a two-dimensional light receiving element.

To obtain the height information of the entire exposure region, it is necessary to capture the pattern image of the exposure region with a high-resolution camera, transfer the image data obtained by image capturing to a controller, and process the image data by the controller. The time required for these processing operations can be a problem. In the exposure apparatus, productivity such as throughput is also one of important performance indices, so that it is desirable to obtain the height information with high accuracy in the shortest possible time.

SUMMARY OF THE INVENTION

The present invention provides a technique advantageous in achieving both measurement accuracy and throughput regarding height measurement of a substrate surface.

The present invention in its one aspect provides an exposure apparatus for projecting a pattern of an original onto a substrate by a projection optical system, and exposing the substrate, comprising a stage configured to move while holding the substrate, a measurement device configured to perform, at a plurality of measurement points in an exposure region, measurement of a height position of the substrate held by the stage, and a controller configured to control the measurement device, and correct a position of the stage based on a result of the measurement such that a shift amount of the height position with respect to an image plane of the projection optical system is decreased, wherein the controller is configured to set the plurality of measurement points in the exposure region based on information regarding the exposure region.

Further features of the present invention will become apparent from the following description of exemplary embodiments (with reference to the attached drawings).

BRIEF DESCRIPTION OF THE DRAWINGS

FIG. 1 is a view showing the arrangement of an exposure apparatus;

FIG. 3 is a view showing an example of a light projection pattern projected onto a substrate;

FIG. 4 is a graph illustrating the relationship between the number of measurement points and the primary plane correction residual;

FIGS. 17A to 17C are views for explaining processing of setting a plurality of measurement points by selecting some of the distribution measurement points;

FIG. 18 is a flowchart illustrating an exposure method;

DESCRIPTION OF THE EMBODIMENTS

Figure 2:
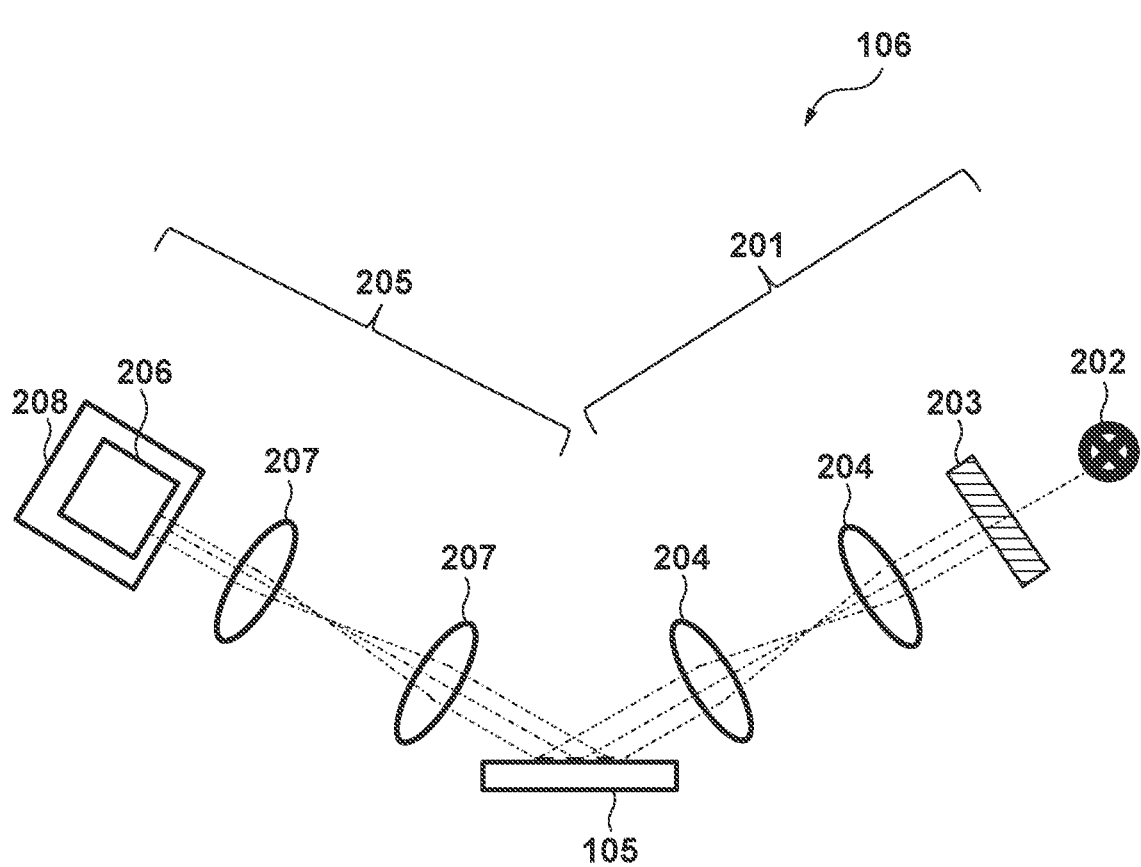
FIG. 2 is a view showing the arrangement of a measurement device.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

Example 1

FIG. 1 is a view showing the arrangement of an exposure apparatus 100 according to the first embodiment. The exposure apparatus 100 is one form of a lithography apparatus used in a photolithography process as a device or flat panel manufacturing process. The exposure apparatus 100 projects the pattern of an original onto a substrate by a projection optical system, and exposes the substrate. The exposure apparatus 100 is a step-and-repeat type exposure apparatus or a step-and-scan type exposure apparatus, and exposes a substrate via an original (mask), thereby transferring the pattern of the mask to the substrate. The exposure method is not limited, but a description will be given below assuming that the exposure apparatus 100 is a step-and-repeat type exposure apparatus.

An illumination optical system 102 guides light from a light source 101 and illuminates a mask 103 serving as an original. The light source 101 can be formed by an i-line mercury lamp, an excimer laser, or the like. A pattern to be projected is drawn in the mask 103. The light having passed through the mask 103 reaches a substrate 108 on a stage 105 through a projection optical system 104. The stage 105 is a substrate stage that moves while holding the substrate 108. The image of the mask pattern projected onto the substrate 108 causes reaction of a photosensitive material such as a resist applied on the surface of the substrate 108 in advance. By developing it, a pattern is formed on the surface of the substrate 108. By repeating the step-driving operation of the stage 105 holding the substrate 108 and the exposure operation of a predetermined exposure region (shot region), exposure is performed over the entire surface on the substrate 108. During the exposure operation, a position measurement apparatus such as an interferometer or an encoder (not shown) measures the position and posture of the stage 105 with high accuracy. With this, overlay exposure with high accuracy is implemented.

During exposure, in order to adjust the height and tilt of the substrate with respect to the position of the image of the mask pattern, a measurement device 106 measures the height of the substrate 108, and at least one of the height and tilt of the stage 105 is controlled based on the measurement result. Note that, in the following description, controlling at least one of the height and tilt of the stage 105 will be sometimes simply referred to as "height position adjustment of the substrate".

With reference to FIG. 2, the arrangement of the measurement device 106 will be described. The measurement device 106 detects the height of a point of interest in a detection region. The measurement device 106 includes a light projector 201 and a light receiver 205.

The light projector 201 can include a light source 202 that makes light obliquely enter the surface of an object (substrate 108) on the stage 105, a two-dimensionally arrayed light projection pattern 203, and a light projecting optical system 204 used to project the light projection pattern 203 to the object. Note that the light projecting optical system 204 need not be provided depending on the kind of the light source 202 and the distance between the light projection pattern 203 and the object. Alternatively, the light projection pattern 203 and the object may be set in the relationship of a Scheimpflug optical system by using the light projecting optical system 204. The measurement accuracy can be improved by focusing the entire surface of the light projection pattern 203 on the object. Further, when measuring the height of the object, it can be prevented that a local tilt of the object causes a change of the measurement value.

The light receiver 205 can include a light receiving optical system 207 and a camera 208. The light reflected by the object enters the camera 208 via the light receiving optical system 207. The camera 208 can include a light receiving element 206 that includes a plurality of two-dimensionally arrayed pixels. Note that the light receiving optical system 207 need not be provided depending on the kind of the light source 202 and the distance between the object and the camera 208. Alternatively, the object and the light receiving element 206 may be set in the relationship of a Scheimpflug optical system by using the light receiving optical system 207. The measurement accuracy can be improved by focusing the entire surface of object on the light receiving element 206. Further, when measuring the height of the object, it can be prevented that a local tilt of the object causes a change of the measurement value.

Respective components of the exposure apparatus 100 including the measurement device 106, the stage 105, and the projection optical system 104 are connected to a controller 107. The controller 107 can be formed by, for example, a computer apparatus including a processor (CPU) and a memory. The controller 107 can store information of the height and tilt of the substrate measured by the measurement device 106, and the like, and control the stage 105 by issuing a driving instruction to the stage 105.

An example of a height measurement method using the measurement device 106 will be described. If the height of the object (substrate 108) fluctuates, the position of the image of the light projection pattern 203 projected onto the object fluctuates. If the position of the image of the light projection pattern 203 projected onto the object fluctuates, the position of the pattern image on the light receiving element 206 also fluctuates. The controller 107 detects the positional shift of the pattern image on the light receiving element 206, thereby obtaining the height position of the substrate 108.

FIG. 3 shows an example of a light projection pattern 301 projected onto the substrate. The light projection pattern 203 in the light projector 201 is projected onto an exposure region 302 serving as the precision inspection region of the substrate 108. On the exposure region 302, the light projection pattern 301 corresponding to the light projection pattern 203 appears. As shown in FIG. 3, the light projection pattern 301 includes a plurality of slit images. To measure the height in the precision inspection region of the substrate 108 in detail, a pattern interval 303 of the light projection pattern 301 needs to be as narrow as possible. When the light receiving element 206 is a two-dimensional light receiving element, the height map information of the entire exposure region can be obtained with the measurement interval defined by the light projection pattern 301 on the substrate and the size of the light receiving element.

The measurement device 106 measures, at a plurality of measurement points in the exposure region, the height position of the substrate 108 held by the stage 105. After that, based on the result of the measurement by the measurement device 106, the controller 107 corrects the position of the stage 105 (height position adjustment) such that the shift amount of the height position of the substrate 108 with respect to the image plane of the projection optical system 104 is decreased. The height position adjustment of the substrate during exposure is performed by controlling the height and tilt of the stage 105. Therefore, even if the height map in the exposure region is measured in detail, control is performed only on the primary plane components in the height and tilt directions.

To solve this problem, in this embodiment, the controller 107 determines the required number of measurement points based on the relationship, obtained in advance, between the number of measurement points and the correction residual by correction of the position of the stage 105 for each size of the exposure region, and determines the number of divisions of the exposure region in accordance with the determined required number of measurement points. FIG. 4 is a graph illustrating the relationship between the number of measurement points in height measurement in the exposure region and the primary plane correction residual in the exposure region. FIG. 4 shows the relationship in a case in which the size of the exposure region (shot region) is of 26 mm×33 mm, and the relationship in a case in which the size of the exposure region is of 10 mm×10 mm. The required accuracy is determined from the depth of focus of the projection lens. The number of measurement points is determined such that the primary plane correction residual becomes smaller than that corresponding to the required accuracy. According to FIG. 4, when the size of the exposure region is of 26 mm×33 mm, the number of measurement points needs to be b or more for the primary plane correction residual smaller than that corresponding to the required accuracy. Further, according to FIG. 4, when the size of the exposure region is of 10 mm×10 mm, the number of measurement points may be a or more smaller than b for the primary plane correction residual smaller than that corresponding to the required accuracy.

Figures 5A, 5B, 5C, 5D:
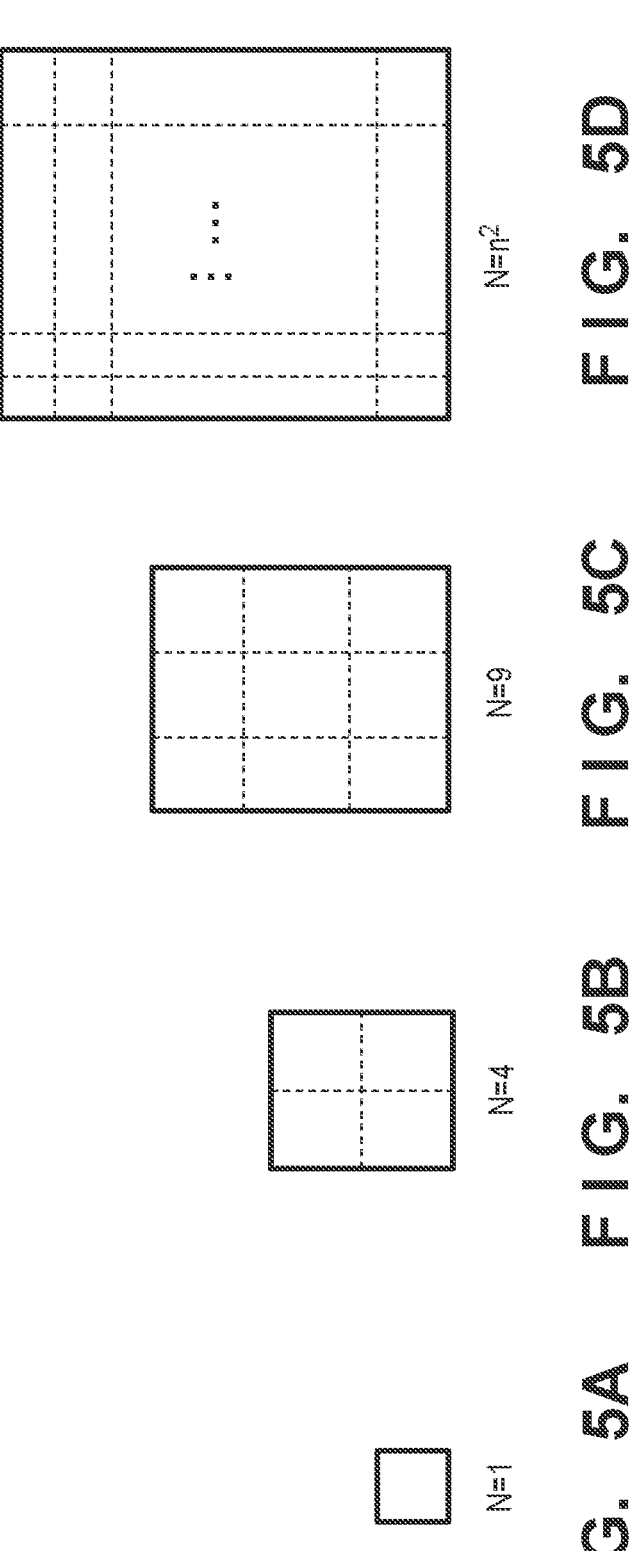
FIGS. 5A to 5D are views for explaining a method of dividing a measurement region.

In this embodiment, in order to acquire features in the exposure region, the controller 107 sets a plurality of measurement points such that one measurement point is assigned to each of a plurality of sub-regions obtained by dividing the exposure region based on the position or size of the exposure region. With reference to FIGS. 5A to 5D, a method of dividing the exposure region in this embodiment will be described. As shown in FIG. 4 described above, the number of measurement points A required for height position measurement is obtained from the size of the exposure region. Based on the required number of measurement points A thus obtained, the number of divisions N is determined as follows:

if the required number of measurement points A=1, the number of divisions N=1 (FIG. 5A);

if 1<the required number of measurement points A≤4, the number of divisions N=4 (FIG. 5B);

if 4<the required number of measurement points A≤9, the number of divisions N=9 (FIG. 5C).

Similarly, if $(n-1)^2$<the required number of measurement points A≤$n^2$, the number of divisions N=$n^2$ (FIG. 5D) (where n is the number of equal divisions in vertical and horizontal directions).

Figures 6, 7, 8:
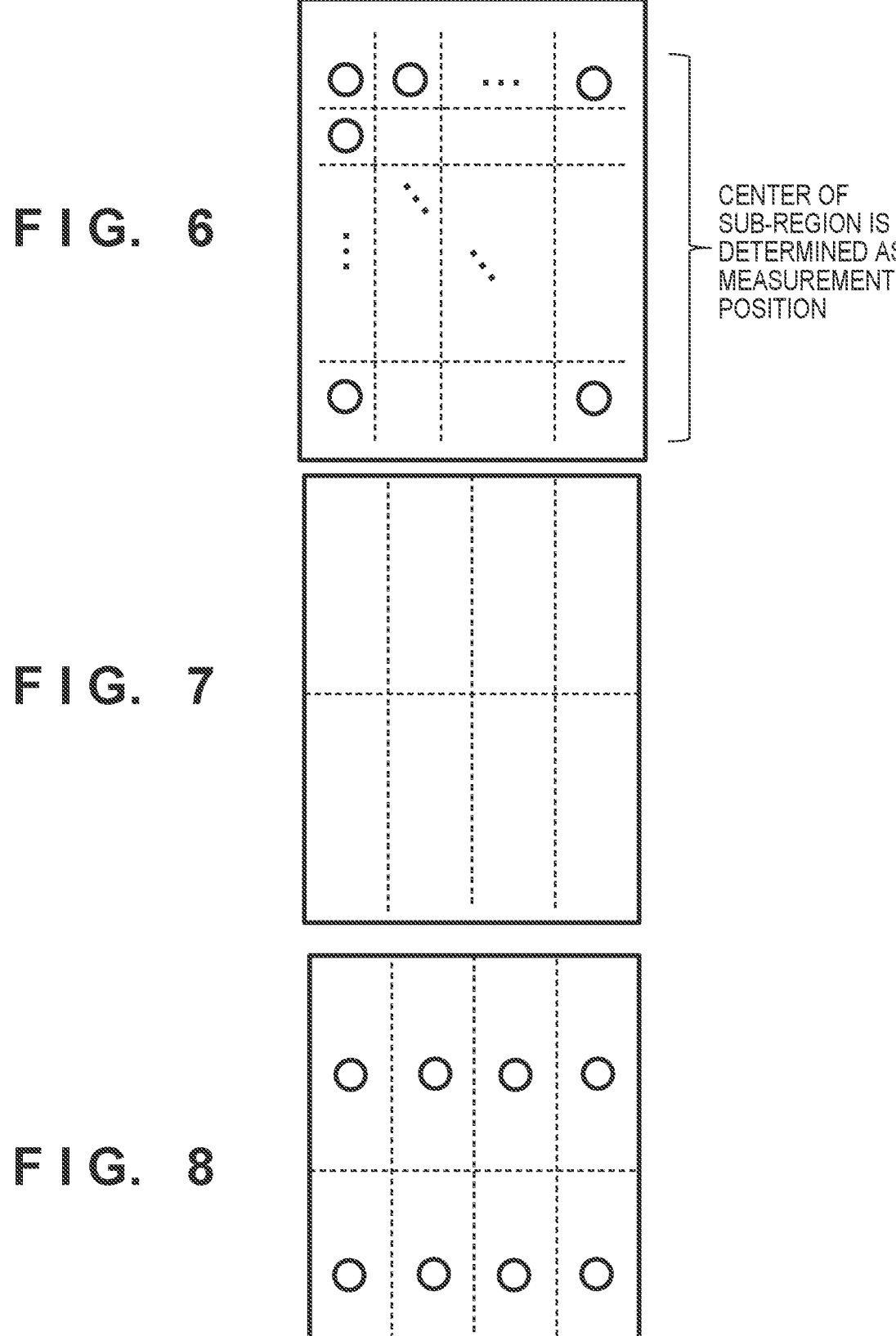
FIG. 6 is a view showing a measurement position in each sub-region.
FIG. 7 is a view showing an example of a plurality of chip regions formed in a shot region.
FIG. 8 is a view showing a measurement position in each chip region.

The controller 107 divides the exposure region with the number of divisions N thus determined, and sets the plurality of measurement points such that one measurement point is assigned to each of the plurality (N) of sub-regions thus obtained. In an example, the controller 107 determines the center of the sub-region as the measurement position as shown in FIG. 6.

The controller 107 performs height position measurement using the measurement device 106 at a plurality of measurement positions determined as described above. Based on the result measured by the measurement device 106, the controller 107 performs position correction of the stage 105 such that the substrate surface matches the focal position of the projection optical system 104, that is, the shift amount of the height position of the substrate surface with respect to the image plane of the projection optical system 104 is decreased. After that, the controller 107 executes exposure.

As has been described above, the controller 107 divides the exposure region based on the size of the exposure region such that features in the exposure region can be acquired, and performs height position measurement for each of a plurality of sub-regions obtained by the division. With this, it is possible to shorten the data transfer time and processing time without sacrificing measurement accuracy.

Note that in this embodiment, the method of dividing the measurement region so as to obtain squarely arranged measurement positions has been described as an example, but the division method is not limited to this. It is possible to employ various methods that equally arrange the measurement positions.

Example 2

In Example 2, the controller 107 divides the exposure region based on the position of the exposure region such that features in the exposure region can be acquired, and performs height position measurement for each of a plurality of sub-regions obtained by the division. In general, a plurality of chip pattern regions are formed in the mask. The number of chip pattern regions is arbitrary. The plurality of chip pattern regions include the same pattern. One chip pattern region corresponds to one chip (die) to be manufactured. A normal shot region (exposure region) has a size where all of the plurality of chip pattern regions of the mask can be projected. For example, assume a case in which 4×2=8 chip pattern regions are formed in the mask. In this case, as shown in FIG. 7, 4×2=8 chip regions are formed in one shot region of the substrate in correspondence with the array of the chip pattern regions of the mask. In this case, the plurality of sub-regions correspond to the plurality of chip regions.

When collectively exposing the plurality of chip regions in one shot region, height position adjustment between chips in the shot region is important. In this example, as shown in FIG. 8, the center of each chip region is set as the measurement position. With this, it is possible to perform height position adjustment of each chip region in the shot region with high accuracy.

Example 3

In this embodiment, the exposure region is one region of interest of a plurality of shot regions of the substrate 108. The plurality of shot regions of the substrate 108 can include full shot regions located in the central portion of the substrate, and partial shot regions located in the outer peripheral portion of the substrate. The full shot region has a size where the entire pattern region of the mask 103 is transferred. Accordingly, the full shot region includes the plurality of chip regions corresponding to the plurality of chip pattern regions of the mask 103. The partial shot region has a size where only a part of the pattern region of the mask 103 is transferred. Particularly, the partial shot region includes one or more chip regions corresponding to only some of the plurality of chip pattern regions of the mask 103.

Figures 9, 10A, 10B:
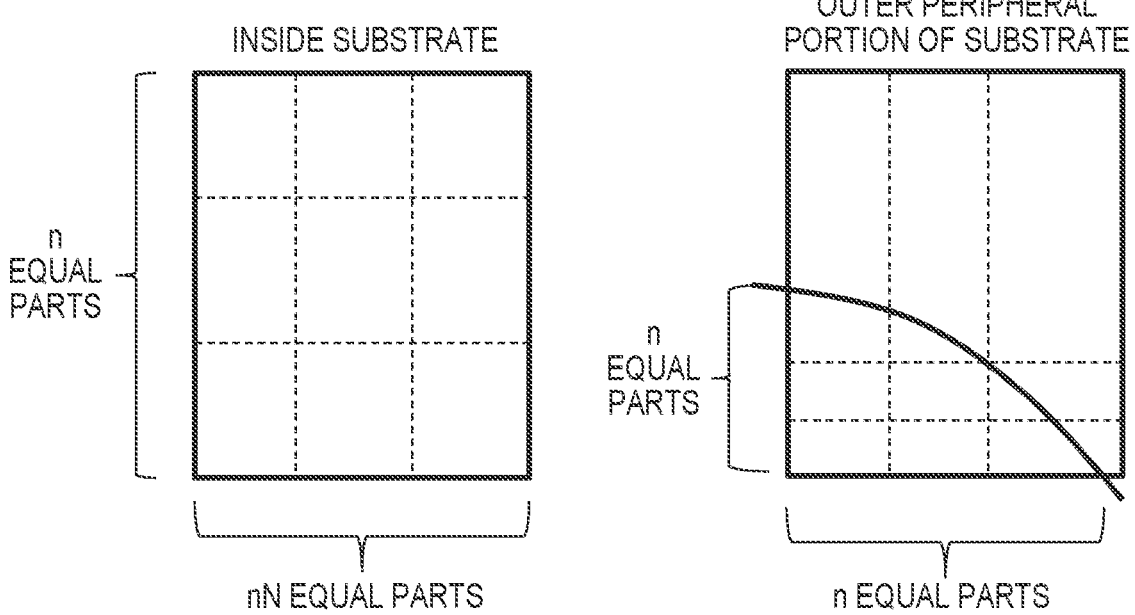
FIG. 9 is a view showing an example of a partial shot region located in the outer peripheral portion of a substrate.
FIGS. 10A and 10B are views for explaining a method of dividing a measurement region in the partial shot region.

With reference to FIG. 9, an example will be described in which the height position of the partial shot region located in the outer peripheral portion of the substrate is measured, and exposure is performed. In the outer peripheral portion of the substrate, a shape change is sometimes larger than in the full shot region due to the influence of roll-off, warping, sagging, or the like. In addition, in exposure of the partial shot region, since the object does not exist in a region outside the substrate, the height position information of this region cannot be obtained. In this case, a region division method is set that can accurately acquire the feature of a sharp height change in the partial shot region. Note that an increase in the number of measurement positions along with an increase in the number of divisions leads to an increase in processing time. Therefore, in this example, the measurement positions are determined in accordance with the shape of the partial shot region so as not to change the number of divisions.

Figure 11:
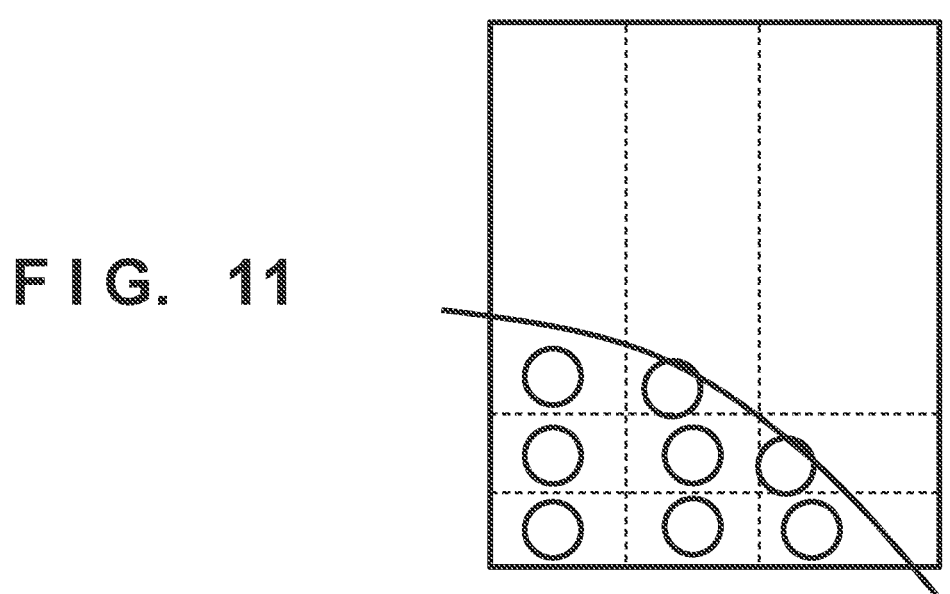
FIG. 11 is a view showing a measurement position determined for each sub-region of the partial shot region.

FIGS. 10A and 10B show an example of division of the partial shot region. FIG. 10A shows an example of division of the full shot region. For the full shot region, the controller 107 divides it into equal parts (n equal parts) in the vertical direction (the first direction) and the horizontal direction (the second direction orthogonal to the first direction) (in the example shown in FIG. 10A, n=3). The number of divisions in this case is expressed by N=$n^2$. On the other hand, for the partial shot region, the controller 107 divides only the region within the substrate into n equal parts in the vertical and horizontal directions, as shown in FIG. 10B. As shown in FIG. 11, the center of each sub-region in the substrate is set as the measurement position.

Figure 20:
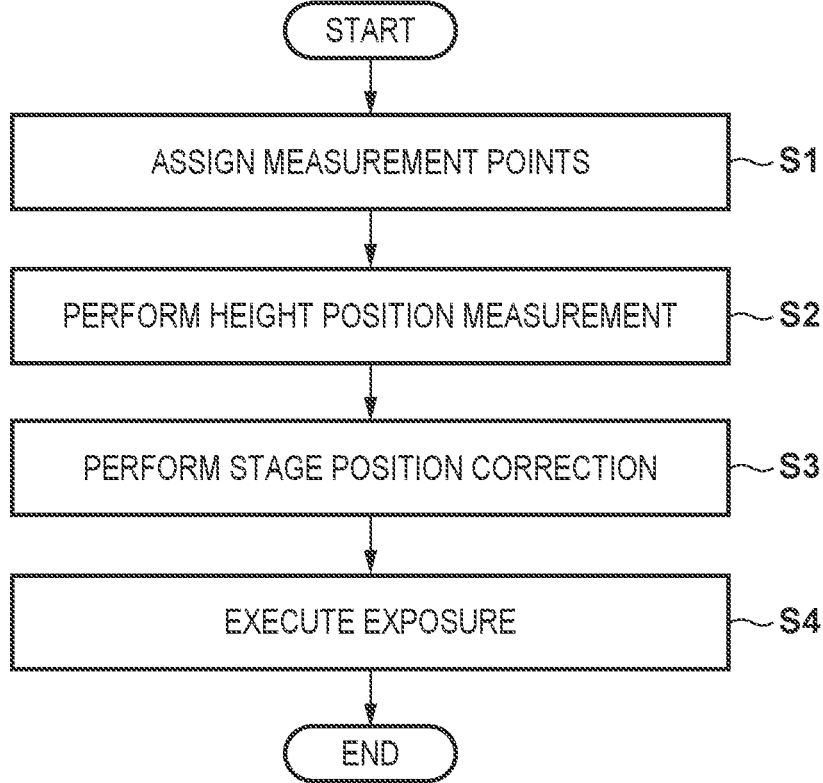
FIG. 20 is a flowchart illustrating an exposure method.

FIG. 20 illustrates a flowchart of an exposure method according to this embodiment. In step S1, the controller 107 assigns measurement points to the exposure region. In this embodiment, a plurality of measurement points are set in the above-described method such that one measurement point is assigned to each of a plurality of sub-regions obtained by dividing the exposure region based on the position or size of the exposure region. In step S2, the controller 107 performs height position measurement of the substrate 108 held by the stage 105 at the plurality of measurement points in the exposure region on the substrate. In step S3, based on the measurement result in step S2, the controller 107 corrects the position of the stage 105 such that the shift amount of the height position of the substrate 108 with respect to the image plane of the projection optical system 104 is decreased. After the position of the stage is corrected, the controller 107 exposes the exposure region in step S4.

Second Embodiment

Figure 12:
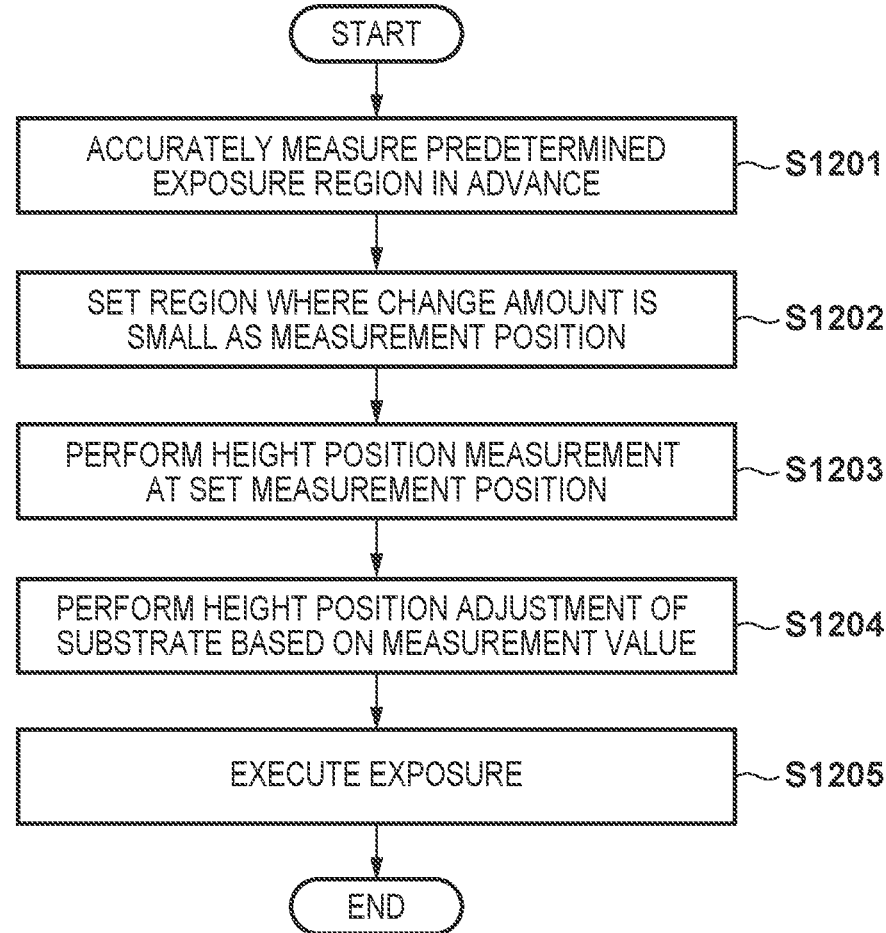
FIG. 12 is a flowchart illustrating an exposure method.

FIG. 12 illustrates a flowchart of an exposure method in the second embodiment. In the first embodiment described above, the example has been described in which the region of interest is divided into equal parts. However, in the exposure region, fine protrusions and recesses and materials having different reflectances coexist due to wiring patterns such as various kinds of circuit patterns. When obtaining the height position information from the light projection pattern reflected by the object, the shape of reflected light largely changes at a portion where the step of the protrusion/recess sharply changes or the position of the wiring pattern having a high reflectance, and the measurement accuracy can deteriorate.

Figures 13, 14, 15, 16:
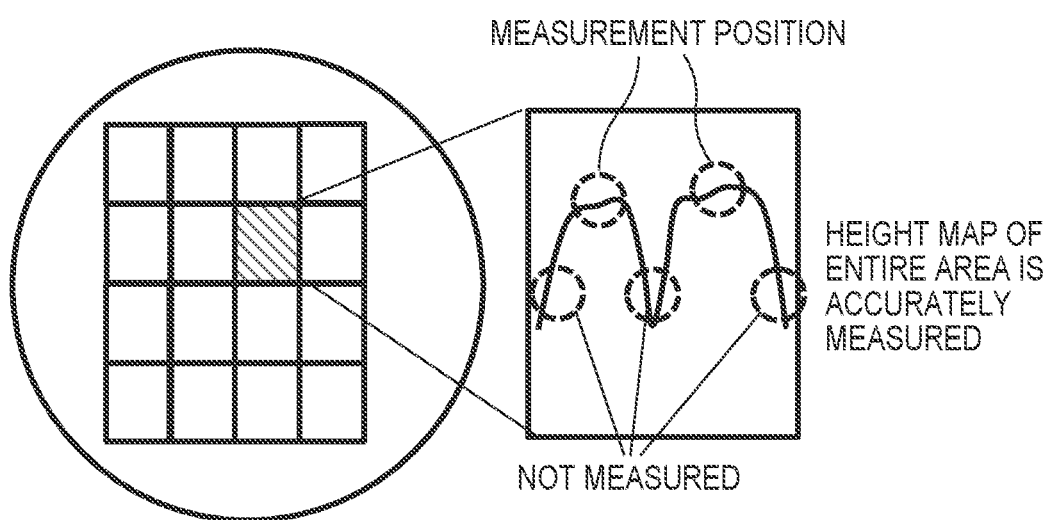
FIG. 13 is a view showing an example of the height map in a sample shot region.
FIG. 14 is a view for explaining a method of determining a measurement position using the differential value of height position measurement values.
FIG. 15 is a view for explaining a method of determining a measurement position based on the measurement reproducibility.
FIG. 16 is a view showing an example of distribution measurement points pre-existing over the entire exposure region.

To solve this problem, in this embodiment, in step S1201, a controller 107 accurately measures the height position in the entire area of a predetermined one sample shot region of a plurality of shot regions in the substrate. FIG. 13 shows an example of the height distribution (height map) obtained in advance by measuring the height positions in one sample shot region (sample region). According to the height map, it can be seen that recesses and protrusions (changes in height position) exist in the exposure region. The measurement accuracy in a case in which height position measurement is performed in a portion where the height position sharply changes is lower than the measurement accuracy in a case in which height position measurement is performed in a portion where the height position is flat.

Therefore, in step S1202, the controller 107 determines the positions of a plurality of measurement points in the exposure region based on the height distribution obtained in step S1201, as shown in FIG. 13. For example, the controller 107 sets, as the position of the measurement point, the position where the change amount of the height position in the height distribution is smaller than a predetermined value in one exposure region. A specific example will be described with reference to FIG. 14. FIG. 14 shows an example of partial regions in one sample shot region, in each of which precision measurement of height position is performed. The size of the partial region can be determined based on the minimum measurement unit defined from the measurement resolution of a light receiver 205. The height map can be obtained from a set of height measurement values of respective partial regions. The controller 107 can obtain the differential value of the measurement values in adjacent partial regions, and set, as the measurement position, the partial region where the differential value is equal to or smaller than a predetermined threshold value T1.

As another method, as shown in FIG. 15, the controller 107 executes processing of obtaining the height distribution in the sample region (processing of performing height position measurement in each partial region) a plurality of times to obtain the information of measurement reproducibility. Based on the obtained information of measurement reproducibility, the controller 107 determines positions of a plurality of measurement points in the exposure region. For example, the controller 107 determines, as the measurement position, the partial region where the measurement reproducibility is high. The measurement reproducibility is expressed by, for example, a variation σ of a plurality of measurement values obtained by executing height position measurement a plurality of times. It can be said that the smaller the variation σ, the higher the measurement reproducibility, that is, the higher the measurement accuracy. It can also be said that the larger the variation σ, the lower the measurement reproducibility, that is, the lower the measurement accuracy. Accordingly, the controller 107 can determine, as the measurement position, the partial region where the variation σ is equal to or smaller than a predetermined threshold value T2.

In general, the exposure regions of a substrate have roughly similar uneven shapes. That is, each exposure region of the substrate has an uneven shape similar to that of a sample shot region. By utilizing this tendency, in step S1203, the controller 107 performs height position measurement at the measurement position determined in step S1202 for the entire substrate (that is, for all the exposure regions).

After that, the controller 107 performs height position adjustment of the substrate based on the measurement value obtained in step S1203 (step S1204), and executes exposure (step S1205).

Note that, since the respective exposure regions have similar height position profiles, when exposing the same circuit pattern, steps S1201 and S1202 may be performed in advance for each circuit pattern. With this, the influence on throughput can be further reduced.

Third Embodiment

In the first and second embodiments described above, the example has been described in which the pattern image obtained from the exposure region is divided into parts, and the measurement position is determined from them. In the third embodiment, a plurality of measurement points are set by selecting some of distribution measurement points distributed over the entire exposure region.

FIG. 16 shows an example of distribution measurement points uniformly distributed over the entire exposure region.

This can be implemented by, for example, providing light receiving sensors at a plurality of predetermined positions uniformly distributed over the entire exposure region. Alternatively, this can be implemented by performing height position measurement at the plurality of predetermined positions in the exposure region while scanning or stepping a plurality of times light receiving sensors fewer than the plurality of predetermine positions described above.

To shorten the processing time, a controller 107 selects, from the distribution measurement points uniformly distributed over the entire exposure region as shown in FIG. 16, the minimum number of measurement points required to acquire features in the exposure region, and performs height position measurement. FIG. 17A shows that m×n measurement positions exist in the exposure region. Here, let A be the required number of measurement points obtained from, for example, the relationship shown in FIG. 4. At this time, if m×n is larger than 2×A, the measurement points to be used for height position measurement are thinned out as shown in FIG. 17B or 17C. This processing is ultimately repeated as long as the number of measurement points is larger than the required number of measurement points A. Thus, position height measurement with high accuracy can be implemented at the minimum required measurement positions.

Fourth Embodiment

Consider the example described in the third embodiment, in which a plurality of measurement positions are uniformly distributed over the entire exposure region as shown in FIG. 16. FIG. 18 illustrates a flowchart of an exposure method in this case.

In step S1801, a controller 107 performs height position measurement a plurality of times at each of distribution measurement points in one predetermined sample shot region of a plurality of exposure regions in a substrate. The controller 107 calculates, as a value representing the measurement reproducibility, a variation σ of a plurality of measurement values obtained by performing height position measurement the plurality of times.

Figure 19:
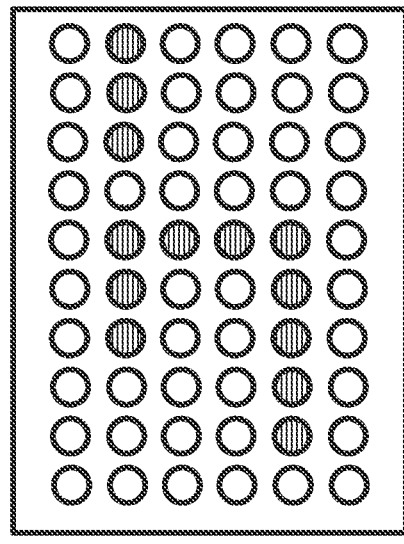
FIG. 19 is a view showing an example of a result of selecting measurement points.

In step S1802, the controller 107 excludes, from the measurement points to be used, the measurement point having the variation σ equal to or smaller than a predetermined threshold value. That is, the controller 107 determines to use only the measurement point having the variation σ larger than the predetermined threshold value for height position measurement. FIG. 19 shows an example of the result of selecting, as the measurement points to be used for height position measurement, only the measurement points each having the variation σ larger than the predetermined threshold value.

In step S1803, the controller 107 performs height position measurement at the measurement position determined in step S1802 for the entire substrate (that is, all the exposure regions).

After that, the controller 107 performs height position adjustment of the substrate based on the measurement value obtained in step S1803 (step S1804), and executes exposure (step S1805).

In the height position measurement method according to this embodiment, when a measurement error is likely to occur due to the circuit pattern, the measurement points causing the measurement error are not used. Thus, height position measurement can be performed with high accuracy, and highly accurate exposure can be executed.

<Embodiment of Article Manufacturing Method>

An article manufacturing method according to an embodiment of the present invention suitably manufactures an article, for example, a microdevice such as a semiconductor device or an element having a microstructure. The article manufacturing method of this embodiment includes a step of forming a latent pattern by using the above-described exposure apparatus on a photosensitive agent applied on a substrate (a step of exposing the substrate), and a step of developing the substrate on which the latent pattern has been formed in the above step. In addition, the manufacturing method includes other well-known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-071693, filed Apr. 25, 2023, which is hereby incorporated by reference herein in its entirety.

What is claimed is:

1. An exposure apparatus for projecting a pattern of an original onto a substrate by a projection optical system, and exposing the substrate, comprising:
   a stage configured to move while holding the substrate;
   a measurement device configured to perform, at a plurality of measurement points in an exposure region, measurement of a height position of the substrate held by the stage; and a controller configured to control the measurement device, and correct a position of the stage based on a result of the measurement such that a shift amount of the height position with respect to an image plane of the projection optical system is decreased, wherein the controller is configured to set the plurality of measurement points in the exposure region based on information regarding the exposure region, the exposure region is one region of a plurality of shot regions of the substrate, the plurality of shot regions include a full shot region where an entire area of a pattern region of the original is transferred, and a partial shot region where only a part of the pattern region of the original is transferred, and the controller is configured to set different measurement points between the full shot region and the partial shot region.

2. The apparatus according to claim 1, wherein the controller is configured to set the plurality of measurement points in the exposure region such that one measurement point is assigned to each of a plurality of sub-regions obtained by dividing the exposure region based on one of a position and a size of the exposure region.

3. The apparatus according to claim 2, wherein the controller is configured to determine the required number of measurement points based on a relationship, obtained in advance, between the number of measurement points and a correction residual by the correction for each size of the exposure region, and determine the number of divisions of the exposure region in accordance with the determined required number of measurement points.

4. The apparatus according to claim 2, wherein the controller is configured to set a measurement point at a center of each of the plurality of sub-regions.

5. The apparatus according to claim 2, wherein the plurality of sub-regions correspond to a plurality of chip regions.

6. The apparatus according to claim 1, wherein for the full shot region, the controller is configured to divide the full shot region into n equal parts in a first direction and a second direction orthogonal to the first direction, and for the partial shot region, the controller is configured to divide only a region within the substrate into n equal parts in the first direction and the second direction.

7. The apparatus according to claim 1, wherein for the full shot region, the controller is configured to set a measurement point at a center of each of the plurality of sub-regions, and for the partial shot region, the controller is configured to set a measurement point at a center of each of a plurality of sub-regions in a region within the substrate.

8. The apparatus according to claim 1, wherein the controller is configured to set the plurality of measurement points by selecting some of distribution measurement points uniformly distributed over an entire area of the exposure region.

9. The apparatus according to claim 1, wherein the controller is configured to determine positions of the plurality of measurement points in the exposure region based on a height distribution in a sample region obtained in advance.

10. The apparatus according to claim 9, wherein the controller is configured to determine, as a position of a measurement point, a position where a change amount of a height position in the height distribution is smaller than a predetermined value.

11. The apparatus according to claim 9, wherein the controller is configured to determine positions of the plurality of measurement points in the exposure region based on information obtained by performing processing of obtaining a height distribution in the sample region a plurality of times.

12. The apparatus according to claim 7, wherein the controller is configured to set the plurality of measurement points by selecting some of distribution measurement points uniformly distributed over an entire area of an exposure region.

13. The apparatus according to claim 1, wherein the measurement device projects a pattern to an entire area of the exposure region to perform measurement of the height position of the substrate.

14. An exposure method of projecting a pattern of an original onto a substrate by a projection optical system, and exposing the substrate, comprising:

performing, at a plurality of measurement points in an exposure region on the substrate, measurement of a height position of the substrate held by a stage;

correcting a position of the stage based on a result of the measurement such that a shift amount of the height position with respect to an image plane of the projection optical system is decreased; and exposing the exposure region after correcting the position of the stage, wherein the plurality of measurement points in the exposure region are set based on information regarding the exposure region, the exposure region is one region of a plurality of shot regions of the substrate, the plurality of shot regions include a full shot region where an entire area of a pattern region of the original is transferred, and a partial shot region where only a part of the pattern region of the original is transferred, and different measurement points between the full shot region and the partial shot region are set.

15. An article manufacturing method comprising:

exposing a substrate in accordance with an exposure method defined in claim 14; and developing the exposed substrate, wherein an article is manufactured from the developed substrate.

* * * * *